United States Patent
Lee et al.

(10) Patent No.: US 11,592,492 B2
(45) Date of Patent: Feb. 28, 2023

(54) DEVICE AND METHOD FOR DIAGNOSING BATTERY PACK

(71) Applicant: Samsung SDI Co., Ltd., Yongin-si (KR)

(72) Inventors: Soojin Lee, Yongin-si (KR); Imsu Choi, Yongin-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 460 days.

(21) Appl. No.: 16/611,723

(22) PCT Filed: Jan. 30, 2018

(86) PCT No.: PCT/KR2018/001256
§ 371 (c)(1),
(2) Date: Nov. 7, 2019

(87) PCT Pub. No.: WO2018/225930
PCT Pub. Date: Dec. 13, 2018

(65) Prior Publication Data
US 2020/0103467 A1  Apr. 2, 2020

(30) Foreign Application Priority Data

Jun. 8, 2017 (KR) ........................ 10-2017-0071887

(51) Int. Cl.
*G01R 31/371* (2019.01)
*H04L 51/046* (2022.01)
(Continued)

(52) U.S. Cl.
CPC ......... *G01R 31/371* (2019.01); *G01R 31/396* (2019.01); *H04L 51/046* (2013.01);
(Continued)

(58) Field of Classification Search
CPC ............ H01M 10/4285; H01M 10/42; H01M 50/502; H01M 10/48; H01M 10/482;
(Continued)

(56) References Cited

U.S. PATENT DOCUMENTS 9,297,858 B2   3/2016  Lim
2009/0259419 A1  10/2009  Kasai
(Continued)

FOREIGN PATENT DOCUMENTS

CN    200965566 Y   10/2007
CN    203786270 U    8/2014
(Continued)

OTHER PUBLICATIONS

Chinese Office Action, with English translation, dated Apr. 27, 2021, issued in corresponding Chinese Patent Application No. 201880035252.4 (21 pages).
(Continued)

*Primary Examiner* — Melissa J Koval
*Assistant Examiner* — Trung Q Nguyen
(74) *Attorney, Agent, or Firm* — Lewis Roca Rothgerber Christie LLP (57) ABSTRACT

A battery pack diagnosing device mediating signal communication between a battery pack and a user terminal includes a controller generating a wake-up signal based on a user input to a third switch and transmitting the generated wake-up signal to the battery pack, and establishing a communication connection according to a first communication method with the battery pack turned on based on the wake-up signal and receiving state information of the battery pack through the established communication connection.

14 Claims, 9 Drawing Sheets

(51) Int. Cl.
*H04Q 9/00* (2006.01)
*G01R 31/396* (2019.01)

(52) U.S. Cl.
CPC ........... *H04Q 9/00* (2013.01); *H04Q 2209/30* (2013.01); *H04Q 2209/40* (2013.01); *H04Q 2209/883* (2013.01)

(58) Field of Classification Search
CPC ...... G01R 31/3835; G01R 1/20; G01R 31/36; G01R 1/203; G01R 19/165; G01R 15/14; Y02E 60/10
USPC ....... 324/400–434, 500, 600, 764.01, 103 R, 324/771, 761.01, 501, 639, 642, 702, 324/76.11, 76.66, 96
See application file for complete search history.

(56) References Cited

U.S. PATENT DOCUMENTS

| | | | | |
|---|---|---|---|---|
| 2012/0181987 | A1* | 7/2012 | Lee | H02J 7/00308 320/128 |
| 2013/0132011 | A1* | 5/2013 | Mano | H01M 10/482 702/63 |
| 2013/0271146 | A1* | 10/2013 | Sakabe | G01R 31/327 324/415 |
| 2014/0225620 | A1* | 8/2014 | Campbell | H04Q 9/00 324/426 |
| 2014/0312848 | A1 | 10/2014 | Alexander et al. | |
| 2015/0349547 | A1 | 12/2015 | Jeon | |
| 2016/0294019 | A1 | 10/2016 | Yamauchi et al. | |
| 2018/0139698 | A1* | 5/2018 | Quinlan | H04W 52/0235 |

FOREIGN PATENT DOCUMENTS

| | | |
|---|---|---|
| EP | 2099112 A2 | 9/2009 |
| JP | 2002-042897 A | 2/2002 |
| JP | 2002-199465 A | 7/2002 |
| JP | 2005-28900 A | 2/2005 |
| JP | 2012-60836 A | 3/2012 |
| JP | 2013-74784 A | 4/2013 |
| KR | 10-2008-0066794 A | 7/2008 |
| KR | 10-2012-0134611 A | 12/2012 |
| KR | 10-1224340 B1 | 1/2013 |
| KR | 10-2013-0087779 A | 8/2013 |
| KR | 10-2015-0137678 A | 12/2015 |
| KR | 10-1668288 B1 | 10/2016 |
| KR | 10-2017-0035229 A | 3/2017 |

OTHER PUBLICATIONS

Korean Office Action dated Aug. 17, 2021, issued in corresponding Korean Patent Application No. 10-2017-0071887 (6 pages).
Chinese Office Action, with English translation, dated Oct. 11, 2021, issued in corresponding Chinese Patent Application No. 201880035252.4 (18 pages).
EPO Extended European Search Report dated Dec. 9, 2020, for corresponding European Patent Application No. 18814284.8 (9 pages).
International Search Report for corresponding International Application No. PCT/KR2018/001256, dated May 4, 2018, 5pp.
BDT User Guide, P/N P11E01-01-H01, Apr. 12, 2017, 24pp.
Korean Office action issued in the corresponding application No. KR 10-2017-0071887, dated Feb. 14, 2022, 7 pages.
Chinese Decision on Rejection, issued in corresponding Application No. CN 201880035252.4, dated Feb. 7, 2022, with English Translation 19 pages.
European Office Action issued in corresponding Application No. EP 18814284.8, dated Dec. 22, 2022, 5 pages.

* cited by examiner

DEVICE AND METHOD FOR DIAGNOSING BATTERY PACK

CROSS-REFERENCE TO RELATED APPLICATION(S)

This application is a National Phase Patent Application of International Patent Application Number PCT/KR2018/001256, filed on Jan. 30, 2018, which claims priority of Korean Patent Application No. 10-2017-0071887, filed Jun. 8, 2017. The entire contents of both of which are incorporated herein by reference.

STATEMENT REGARDING PRIOR DISCLOSURES BY THE INVENTOR OR A JOINT INVENTOR

The disclosure of "BDT User Guide" was made by the inventor or joint inventor or by another who obtained the subject matter disclosed directly or indirectly from the inventor or a joint inventor. Therefore "BDT User Guide" qualifies as an exception to prior art under 35 U.S.C. 102(b)(1).

TECHNICAL FIELD

The present disclosure relates to battery pack diagnosing devices and methods.

BACKGROUND ART

Recently, battery pack-related technologies have been developed with the development of electric vehicle and energy storage technology. Particularly, technologies for detecting the states of battery packs have been developed to charge, discharge, and manage the battery packs.

Because these technologies are implemented by dedicated equipment arranged in separate facilities, there is an inconvenience of having to disconnect a battery pack from an apparatus such as an electric vehicle or an energy storage and then transfer the battery pack to a separate facility (e.g., a service center) to analyze the cause of abnormality thereof in order to diagnose the battery pack, thus causing incidental limitations such as an increase in the service cost and an increase in the battery unavailability period.

DESCRIPTION OF EMBODIMENTS

Technical Problem

Provided is a battery pack diagnosing device and method that may allow a user to more quickly and easily detect the state of a battery pack at a location where the battery pack is installed and/or used.

Also, provided is a battery pack diagnosing device and method that may allow a user to more quickly and easily detect the state of a battery pack at a location where the battery pack is installed and/or used and to take an immediate action on the battery pack according to the detected state.

Also, provided is a battery pack diagnosing device and method that may perform a more in-depth diagnosis on a battery pack at a location thereof.

Solution to Problem

According to an aspect of the present disclosure, a battery pack diagnosing method includes: generating a wake-up signal of a battery pack based on a user input and transmitting the wake-up signal to the battery pack; establishing a communication connection according to a first communication method with the battery pack turned on based on the wake-up signal; receiving state information of the battery pack through the established communication connection; and transmitting the received state information to a user terminal according to a second communication method.

The battery pack may include a switch for controlling an operation of the battery pack, and the switch may be turned on by the wake-up signal to turn on the battery pack.

The receiving of the state information may include receiving a signal by which the battery pack broadcasts the state information.

The battery pack diagnosing method may further include, after the transmitting of the received state information to the user terminal: receiving at least one of a control signal of the battery pack and a detailed information request signal of the battery pack from the user terminal according to the second communication method; when the received signal is the control signal of the battery pack, transmitting the control signal to the battery pack; and when the received signal is the detailed information request signal of the battery pack, receiving the detailed information from the battery pack in response to the request and transmitting the received detailed information to the user terminal.

According to another aspect of the present disclosure, a battery pack diagnosing device mediating signal communication between a battery pack and a user terminal includes: a first connection terminal electrically connected to at least one of the battery pack and an apparatus equipped with the battery pack; a first switch for changing a communication mode with the apparatus connected to the first connection terminal based on a user input; a second switch for applying power to the battery pack diagnosing device based on a user input; a second connection terminal for supplying power to the battery pack diagnosing device; a communication unit for exchanging signals with the user terminal; a third switch for acquiring a user input for transmitting a wake-up signal to the battery pack; and a controller electrically connected to the first switch, the second switch, the third switch, the first connection terminal, the second connection terminal, and the communication unit.

The controller may generate the wake-up signal based on a user input to the third switch and transmit the generated wake-up signal to the battery pack through the first connection terminal, and establish a communication connection according to a first communication method with the battery pack turned on based on the wake-up signal and receive state information of the battery pack through the established communication connection.

The battery pack diagnosing device may further include a display unit displaying at least one of an operation state of the battery pack diagnosing device, a communication state according to a first communication method with the battery pack, a communication state according to a second communication method with the user terminal, and state information of the battery pack.

The controller may transmit the received state information of the battery pack to the user terminal through the communication unit according to a second communication method.

The controller may receive at least one of a control signal of the battery pack and a detailed information request signal of the battery pack from the user terminal through the communication unit.

The controller, when the received signal is the control signal of the battery pack, may transmit the control signal to the battery pack through the first connection terminal, receive an operation result according to the control signal from the battery pack through the first connection terminal, and transmit the received operation result to the user terminal through the communication unit according to the second communication method.

The controller, when the received signal is the detailed information request signal of the battery pack, may receive the detailed information from the battery pack through the first connection terminal in response to the request and transmit the received detailed information to the user terminal through the communication unit according to the second communication method.

The battery pack diagnosing device may further include a memory storing at least one of an operation state of the battery pack diagnosing device, a communication state according to a first communication method with the battery pack, a communication state according to a second communication method with the user terminal, and state information of the battery pack.

The state information of the battery pack may include state information of a battery management system (BMS) of the battery pack.

The battery pack may include a switch for controlling an operation of the battery pack, and the switch may be turned on by the wake-up signal to turn on the battery pack.

Advantageous Effects of Disclosure

According to various embodiments of the present disclosure, it may be possible to implement a battery pack diagnosing device and method that may allow a user to more quickly and easily detect the state of a battery pack at a location where the battery pack is installed and/or used.

Also, it may be possible to implement a battery pack diagnosing device and method that may allow a user to more quickly and easily detect the state of a battery pack at a location where the battery pack is installed and/or used and to take an immediate action on the battery pack according to the detected state.

Also, it may be possible to implement a battery pack diagnosing device and method that may perform a more in-depth diagnosis on a battery pack at a location thereof.

BEST MODE

According to an embodiment of the present disclosure, a battery pack diagnosing method includes: generating a wake-up signal of a battery pack based on a user input and transmitting the wake-up signal to the battery pack; establishing a communication connection according to a first communication method with the battery pack turned on based on the wake-up signal; receiving state information of the battery pack through the established communication connection; and transmitting the received state information to a user terminal according to a second communication method.

MODE OF DISCLOSURE

The advantages and features of the present disclosure and the accomplishing methods thereof will become apparent from the following description of embodiments taken in conjunction with the accompanying drawings. However, it should be understood that the present disclosure is not limited to the embodiments described below but may be embodied in various different forms and may include all modifications, equivalents, and alternatives falling within the spirit and scope of the present disclosure. The embodiments described below are provided so that the present disclosure will be thorough and complete and will fully convey the scope of the present disclosure to those of ordinary skill in the art. In the following description of the present disclosure, certain detailed descriptions of the related art will be omitted when it is deemed that they may unnecessarily obscure the subject matters of the present disclosure.

For example, particular shapes, structures, and features described herein may be modified from some embodiments to other embodiments without departing from the spirit and scope of the present disclosure. Also, it will be understood that the position or arrangement of individual components in each embodiment may be modified without departing from the spirit and scope of the present disclosure. Thus, the following detailed description should be considered in a descriptive sense only and not for purposes of limitation, and the scope of the present disclosure should be construed as including the appended claims and all equivalents thereof. In the drawings, like reference numerals will denote like elements throughout various aspects. That is, particular details described herein are merely examples. Particular embodiments may vary from these example details and may still be contemplated within the spirit and scope of the present disclosure.

Although terms such as "first" and "second" may be used herein to describe various elements or components, these elements or components should not be limited by these terms. These terms are only used to distinguish one element or component from another element or component.

The terminology used herein is for the purpose of describing particular embodiments only and is not intended to limit the present disclosure. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof. Although terms such as "first" and "second" may be used herein to describe various elements or components, these elements or components should not be limited by these terms. These terms are only used to distinguish one element or component from another element or component.

Hereinafter, embodiments of the present disclosure will be described in detail with reference to the accompanying drawings, and in the following description, like reference numerals will be used to denote like elements and redundant descriptions thereof will be omitted for conciseness.

Figure 1A:
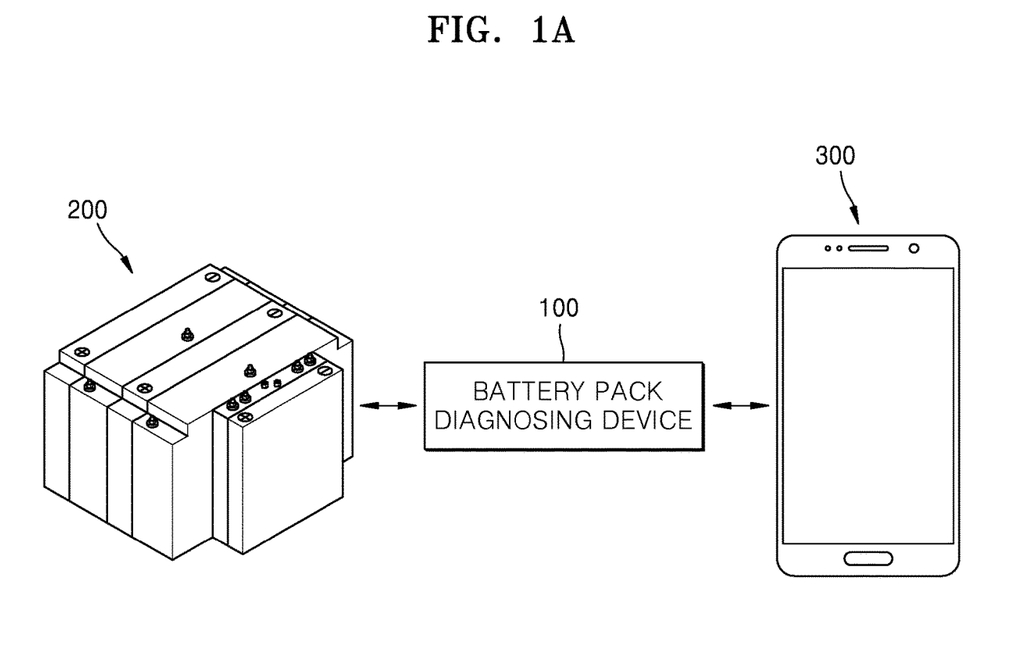
FIGS. 1A and 1B illustrate a configuration of a battery pack diagnosing system according to various embodiments of the present disclosure.
Figure 1B:
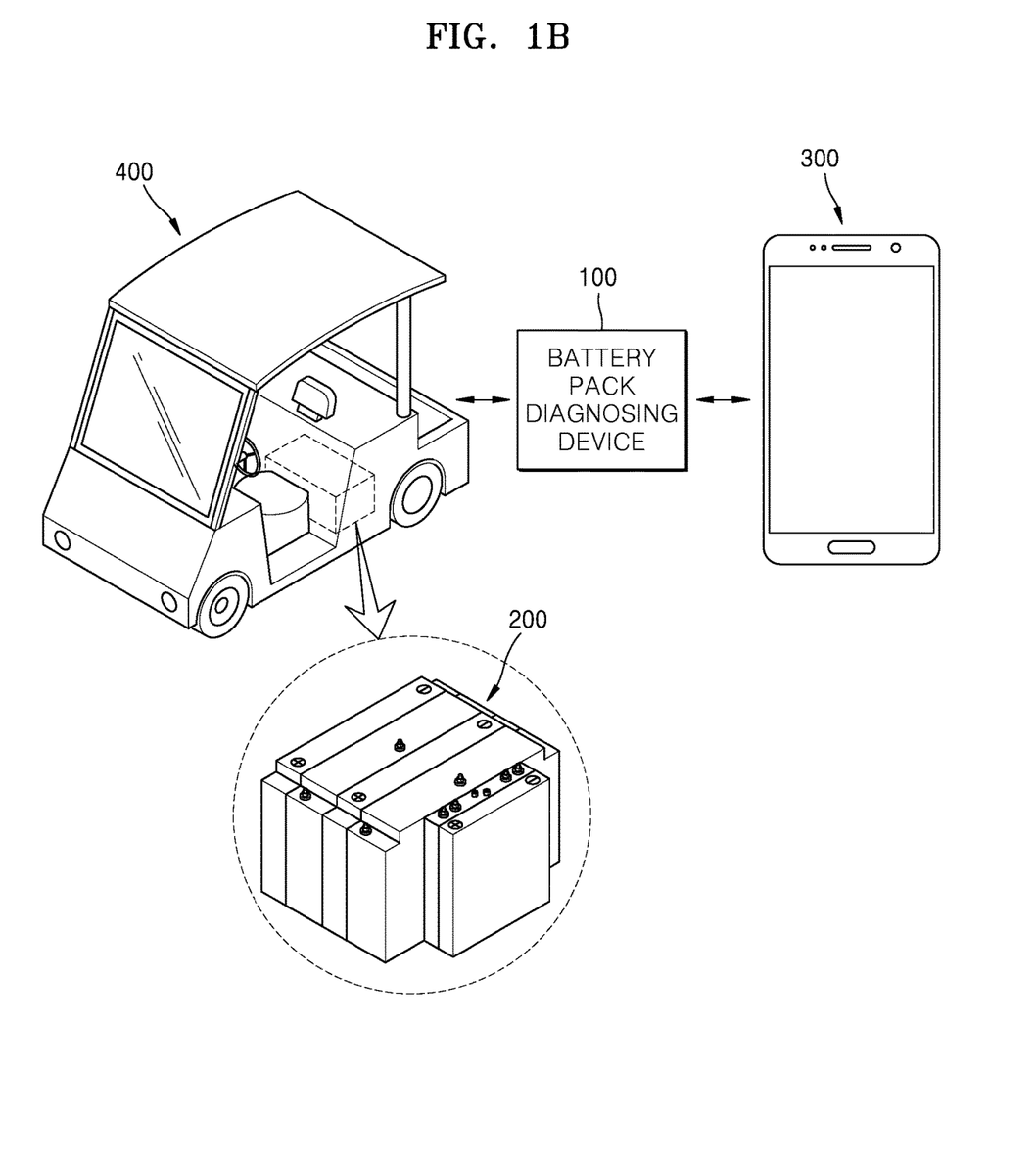

FIGS. 1A and 1B illustrate a configuration of a battery pack (200) diagnosing system according to various embodiments of the present disclosure.

First, referring to FIG. 1A, a battery pack diagnosing device 100 according to an embodiment of the disclosure may be directly connected to a battery pack 200. In this case, the battery pack diagnosing device 100 and the battery pack 200 may be electrically connected by a cable connecting both to each other. Depending on the configuration of the battery pack diagnosing device 100 and the battery pack 200, the battery pack diagnosing device 100 and the battery pack 200 may be connected by a wireless communication method. However, this is merely an example and the present disclosure is not limited thereto.

The battery pack diagnosing device 100 according to an embodiment of the present disclosure may exchange data with (or transmit/receive data to/from) a user terminal 300. In this case, the battery pack diagnosing device 100 may be connected to the user terminal 300 according to various wired or wireless communication methods.

Next, referring to FIG. 1B, a battery pack diagnosing device 100 according to another embodiment of the present disclosure may be connected to an apparatus 400 mounted with a battery pack 200. In other words, the battery pack diagnosing device 100 according to another embodiment of the present disclosure may be indirectly connected to the battery pack 200 through the apparatus 400. In this case, depending on the configuration of the battery pack diagnosing device 100 and the apparatus 400, the battery pack diagnosing device 100 and the apparatus 400 may be connected according to a wired communication method or may be connected according to a wireless communication method. Also, as in the above example, the battery pack diagnosing device 100 may be connected to the user terminal 300 according to various wired or wireless communication methods.

Meanwhile, in the present disclosure, the apparatus 400 may refer to various devices mounted with the battery pack 200. For example, the apparatus 400 may be a vehicle mounted with the battery pack 200 as illustrated and may be any one of an electric vehicle, a cart, an electric bicycle, an electric scooter, and a two-wheeled vehicle. However, this is merely an example and the present disclosure is not limited thereto.

Figure 2:
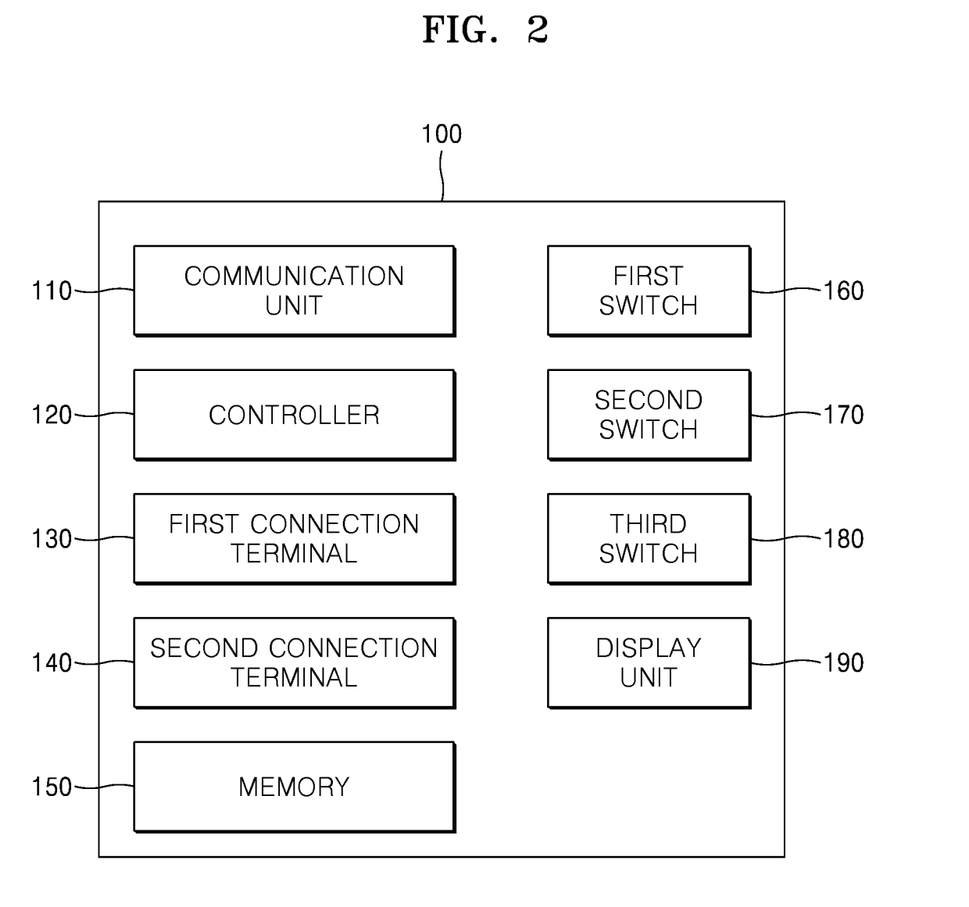
FIG. 2 illustrates a configuration of a battery pack diagnosing device according to an embodiment of the present disclosure.

FIG. 2 illustrates a configuration of a battery pack diagnosing device 100 according to an embodiment of the present disclosure.

The battery pack diagnosing device 100 according to an embodiment of the present disclosure may receive state information of the battery pack 200 from the battery pack 200 and transmit the same to the user terminal 300 or may receive a control signal of the battery pack 200 from the user terminal 300 and transmit the same to the battery pack 200. For this, the battery pack 200 according to an embodiment of the present disclosure may include a communication unit 110, a controller 120, a first connection terminal 130, a second connection terminal 140, a memory 150, a first switch 160, a second switch 170, a third switch 180, and a display unit 190.

First, the communication unit 110 according to an embodiment of the present disclosure may establish a communication connection between the battery pack diagnosing device 100 and another device and exchange data through the established communication connection. For example, the communication unit 110 may establish a communication connection according to a second communication method with the user terminal 300 described above and exchange data with the user terminal 300. In this case, the data may include state information of the battery pack 200 and a control signal of the battery pack 200.

Meanwhile, the "second communication method" may refer to various communication methods as described above. For example, when the user terminal 300 and the battery pack diagnosing device 100 are connected by a wireless communication method, the second communication method may be any one of a Bluetooth communication method, a Wi-Fi communication method, a Zigbee communication method, and an NFC communication method. However, this is merely an example and the present disclosure is not limited thereto.

Meanwhile, the communication unit 110 may establish a communication connection according to a first communication method with the battery pack 200 and exchange data between the battery pack 200 and the battery pack diagnosing device 100 through the established communication connection. In this case, the "first communication method" may refer to various communication methods like the second communication method described above. For example, the first communication method may be any one of a controller area network (CAN) communication method, an RS485 communication method, an RS232 communication method, and an RS422 communication method. However, this is merely an example and the present disclosure is not limited thereto.

The controller 120 according to an embodiment of the present disclosure may be electrically connected to the communication unit 110, the first connection terminal 130, the second connection terminal 140, the memory 150, the first switch 160, the second switch 170, the third switch 180, and the display unit 190. The controller 120 may perform various operations such as initiation of communication with the battery pack 200 and/or the user terminal 300, data transmission/reception (or communication), data calculation (or operation), data processing, and data display. For example, the controller 120 may generate a wake-up signal based on a user input to the third switch 180, which will be described below, and transmit the generated wake-up signal to the battery pack 200 through the first connection terminal 130. A detailed description of the operation of the controller 120 will be given below.

The controller 120 may include any type of device such as a processor that may process data. Here, the "processor" may refer to, for example, a data processing device that is embedded in hardware and has a physically structured circuit to perform a function represented by the commands or code in a program. As an example, the data processing device embedded in hardware may include any processing device such as a microprocessor, a central processing unit (CPU), a processor core, a multiprocessor, an application-specific integrated circuit (ASIC), or a field programmable gate array (FPGA); however, the scope of the present disclosure is not limited thereto.

The first connection terminal 130 according to an embodiment of the present disclosure may be electrically connected to at least one of the battery pack 200 and the apparatus 400 equipped with the battery pack 200. In other words, the first connection terminal 130 may be a terminal to which a communication cable with at least one of the battery pack 200 and the apparatus 400 is connected. In this case, the type of the first connection terminal 130 may be determined according to the communication method between the battery pack diagnosing device 100 and another device. For example, when the first communication method is a CAN communication method as in the example described above, the first connection terminal 130 may be a terminal to which a CAN communication cable is connected.

The first switch 160 according to an embodiment of the present disclosure may change the communication mode between the battery pack diagnosing device 100 and another device connected to the first connection terminal 130 based on a user input. As described above, the first connection terminal 130 may be electrically connected to at least one of the battery pack 200 and the apparatus 400 equipped with the battery pack 200. Thus, a tool for switching the communication mode, such as the first switch 160, may be required to prepare for the connection of both devices having different communication modes to one connection terminal (e.g., the first connection terminal 130).

For example, when the first communication method is a CAN communication method as in the above example, the first switch 160 may change the communication mode by connecting and/or disconnecting a termination resistor for a high-speed CAN mode between a CAN H line and a CAN L line. However, this is merely an example and the present disclosure is not limited thereto.

Meanwhile, the first switch 160 may include any one of a toggle switch, a selector switch, a push button switch, a slide switch, and a tumbler switch. However, this is merely an example and the present disclosure is not limited thereto.

The second switch 170 according to an embodiment of the present disclosure may apply power to the battery pack diagnosing device 100 based on a user input. In other words, the second switch 170 may be a power switch of the battery pack diagnosing device 100.

The battery pack diagnosing device 100 according to an embodiment of the present disclosure may further include an internal battery (not illustrated). The internal battery (not illustrated) may receive power from an external power supply through the second connection terminal 140 described below, store the power, and then supply the power when the battery pack diagnosing device 100 operates. Thus, the second switch 170 may supply or block the power from the internal battery to the battery pack diagnosing device 100 based on a user input.

The second switch 170 may include any one of a toggle switch, a selector switch, a push button switch, a slide switch, and a tumbler switch. However, this is merely an example and the present disclosure is not limited thereto.

The second connection terminal 140 according to an embodiment of the present disclosure may be connected to an external power supply for supplying power to the battery pack diagnosing device 100. When the battery pack diagnosing device 100 is driven by an internal battery (not illustrated) as described above, the second connection terminal 140 may supply power to the internal battery (not illustrated). Also, unlike this, when the battery pack diagnosing device 100 does not include an internal battery (not illustrated), the second connection terminal 140 may directly supply power to each component of the battery pack diagnosing device 100. However, this is merely an example and the present disclosure is not limited thereto.

The third switch 180 according to an embodiment of the present disclosure may acquire a user input for transmitting a wake-up signal to the battery pack 200 connected to the battery pack diagnosing device 100.

In this case, the "wake-up signal" may be a signal for operating the battery pack 200 and may be a signal for turning on the battery pack 200. When the battery pack 200 is in an idle state, because an internal switch (relay) of the battery pack 200 is turned off, the control signal may be transmitted to the battery pack 200 or the state information may be received from the battery pack 200.

Thus, in order to diagnose the battery pack 200, that is, to exchange signals with the battery pack 200, it may be necessary to turn on the internal switch (relay). The third switch 180 may turn on the battery pack 200 by transmitting a wake-up signal to the battery pack 200 based on a user input, to enable diagnosis by the battery pack diagnosing device 100.

The third switch 180 may include any one of a toggle switch, a selector switch, a push button switch, a slide switch, and a tumbler switch. However, this is merely an example and the present disclosure is not limited thereto.

The display unit 190 according to an embodiment of the present disclosure may display at least one of an operation state of the battery pack diagnosing device 100, a communication state according to the first communication method with the battery pack 200, a communication state according to the second communication method with the user terminal 300, and state information of the battery pack 200.

In this case, the display unit 190 may include a display unit for displaying the above information in letters or figures. In this case, the display unit may include any one of a cathode ray tube (CRT), a liquid crystal display (LCD), a plasma display panel (PDP), and an organic light emitting diode (OLED).

Meanwhile, the display unit 190 may include a display unit for displaying the above information by color or the flashing frequency. In this case, the display unit may include, for example, a plurality of light emitting diodes (LEDs).

The information displayed by the display unit 190 may be generated by the controller 120 according to the operation state of the battery pack diagnosing device 100 or may be acquired by the controller 120 from the battery pack 200 or the user terminal 300.

The memory 150 according to an embodiment of the present disclosure may store at least one of an operation state of the battery pack diagnosing device 100, a communication state according to the first communication method with the battery pack 200, a communication state according to the second communication method with the user terminal 300, and state information of the battery pack 200. The information stored in the memory 150 may be used to detect a failure history of the battery pack 200 later.

Meanwhile, in addition to the above information, the memory 150 may temporarily or permanently store data, instructions, programs, program code, or a combination thereof processed by the controller 120. The memory 150 may include magnetic storage media or flash storage media; however, the present disclosure is not limited thereto.

Figure 3:
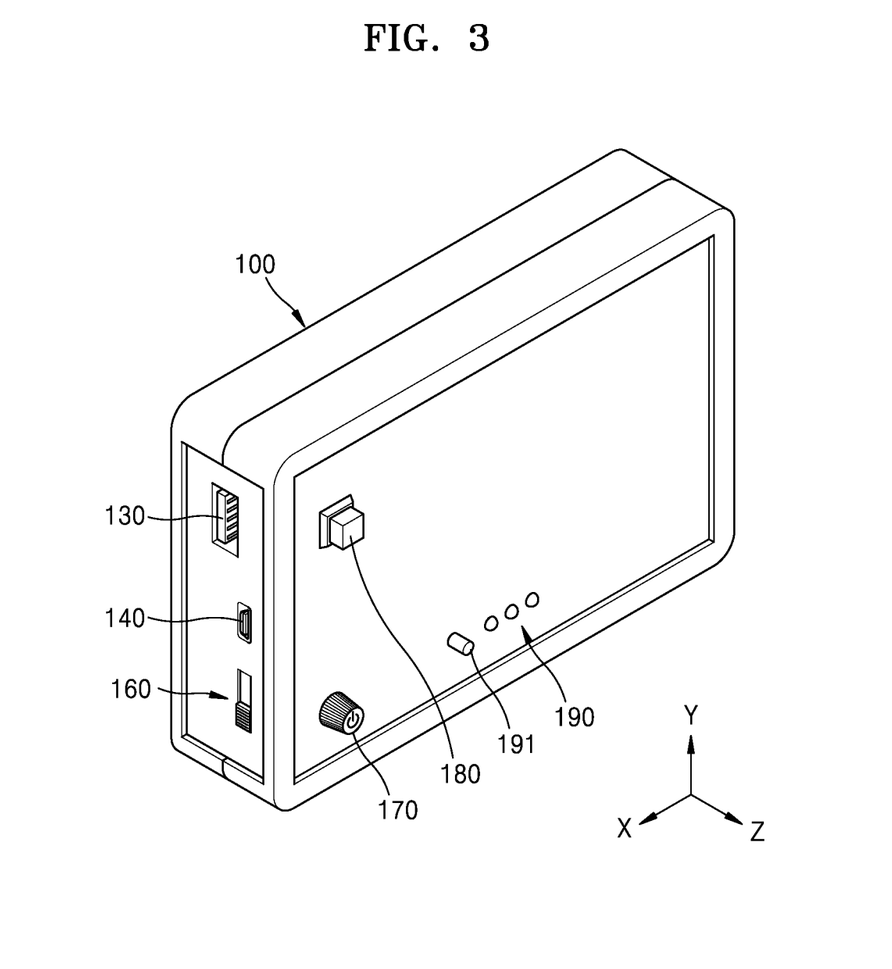
FIG. 3 illustrates an example of a battery pack diagnosing device according to an embodiment of the present disclosure.

FIG. 3 illustrates an example of a battery pack diagnosing device 100 according to an embodiment of the present disclosure.

Referring to FIG. 3, the battery pack diagnosing device 100 may include a first connection terminal 130 electrically connected to at least one of the battery pack 200 and the apparatus 400 equipped with the battery pack 200, a first switch 160 for changing a communication mode with another device connected to the first connection terminal 130 based on a user input, a second switch 170 for applying power to the battery pack diagnosing device 100 based on a user input, a second connection terminal 140 connected to an external power supply for supplying power to the battery pack diagnosing device 100, a third switch 180 for acquiring a user input for transmitting a wake-up signal to the battery pack 200 connected to the battery pack diagnosing device 100, a display unit 190 for displaying various information, and other switches 191.

Meanwhile, although not illustrated in the drawings, the battery pack diagnosing device 100 may further include a communication unit 110, a controller 120, a memory 150, and an internal battery (not illustrated) in addition to the above components; however, because the respective components have already been described in detail with reference to FIGS. 1A and 2, redundant descriptions thereof will be omitted for conciseness.

Hereinafter, with reference to FIGS. 4 to 5B, the operation of the battery pack diagnosing device 100 will be described focusing on the operation of the controller 120.

Figure 4:
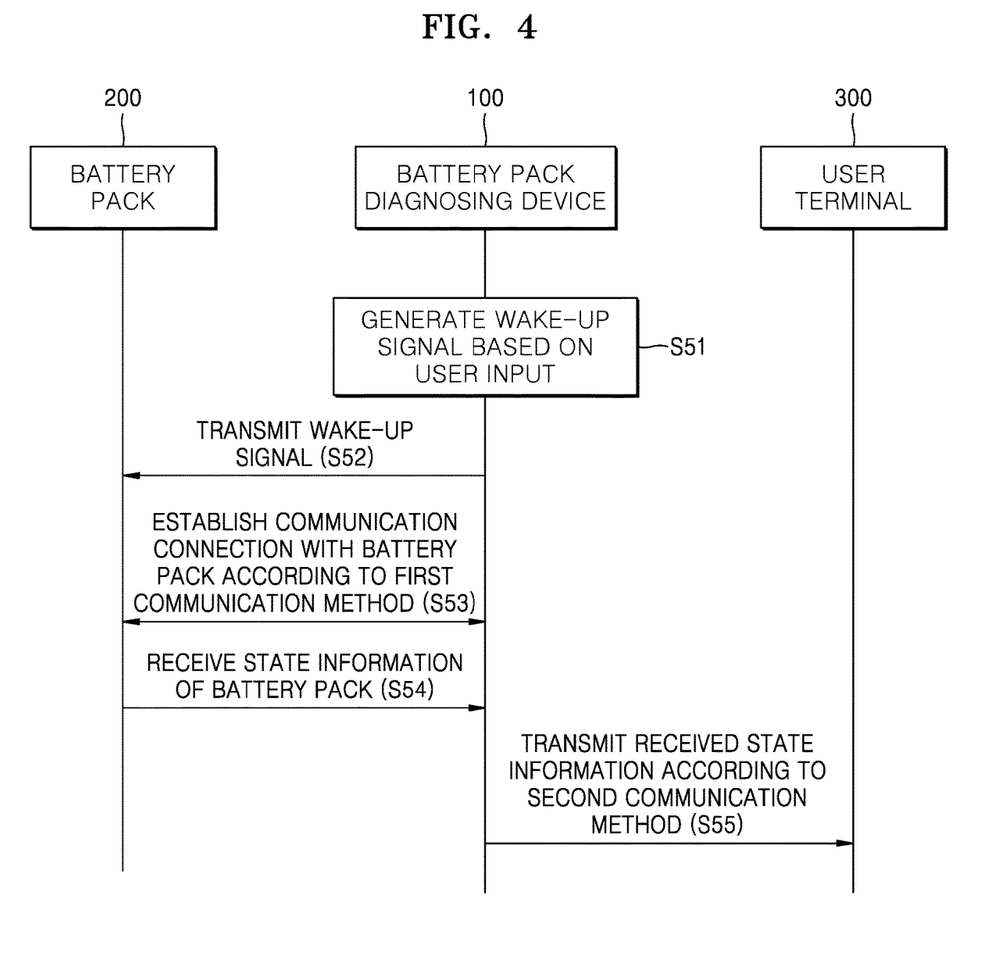
FIG. 4 is a diagram illustrating a process of receiving state information from a battery pack by a battery pack diagnosing device according to an embodiment of the present disclosure.

FIG. 4 is a diagram illustrating a process of receiving state information from a battery pack 200 by a battery pack diagnosing device 100 according to an embodiment of the present disclosure.

The controller 120 according to an embodiment of the present disclosure may generate a wake-up signal of the battery pack 200 based on a user input to the third switch 180 (operation S51), and generate the wake-up signal and transmit the generated wake-up signal to the battery pack 200 (operation S52). As described above, when the battery pack 200 is in an idle state, because the internal switch (relay) of the battery pack 200 is turned off, the control signal may be transmitted to the battery pack 200 or the state information may be received from the battery pack 200. Thus, in order to diagnose the battery pack 200, that is, to exchange signals with the battery pack 200, it may be necessary to turn on the internal switch (relay).

In the related art, when the battery pack 200 fails, the battery pack 200 may have to be transferred to a separate facility in order to wake up and diagnose the battery pack 200. The transfer of the battery may cause secondary limitations such as an increase in the service cost and an increase in the unavailability period of the apparatus 400 mounted with the battery pack 200.

The present disclosure may solve the above limitations caused by the transfer of the battery pack 200, by performing the wake-up and diagnosis of the battery pack 200 through the battery pack diagnosing device 100 and/or the user terminal 300 when the battery pack 200 fails.

The controller 120 according to an embodiment of the present disclosure may establish a communication connection according to the first communication method with the battery pack 200 turned on based on the wake-up signal (operation S53). In the present disclosure, "establishing a communication connection" between two devices may mean assigning identification information to both devices on a network and recognizing the devices mutually. In other words, establishing the communication connection may mean various operations performed as a premise for exchanging signals between both devices. For example, when the first communication method is a CAN communication method, establishing the communication connection may mean performing initialization for CAN communication.

Subsequently, the controller 120 according to an embodiment of the present disclosure may receive state information of the battery pack 200 from the battery pack 200 through the communication connection established in operation S53 (operation S54).

When the communication connection is established, the battery pack 200 according to an embodiment of the present disclosure may broadcast its own state information through the established communication connection. In other words, the battery pack 200 may transmit its own state information to another device on the network without a particular request. As such, the controller 120 may identify the battery state information by receiving the broadcasted signal.

Meanwhile, the state information of the battery pack 200 may include state information of a battery management system (BMS) in the battery pack 200. Thus, the state information of the battery pack 200 may include the voltage, current, charge level, number of cells, identification information, and temperature of the battery pack 200.

The controller 120 according to an embodiment of the present disclosure may transmit the state information received from the battery pack 200 to the user terminal 300 according to the second communication method (operation S55). Also, the controller 120 may display the received state information on the display unit 190 or store the same in the memory 150.

Accordingly, the present disclosure may enable the user to more quickly and easily detect the state of the battery pack 200 at a location where the battery pack 200 is installed and/or used.

Figure 5A:
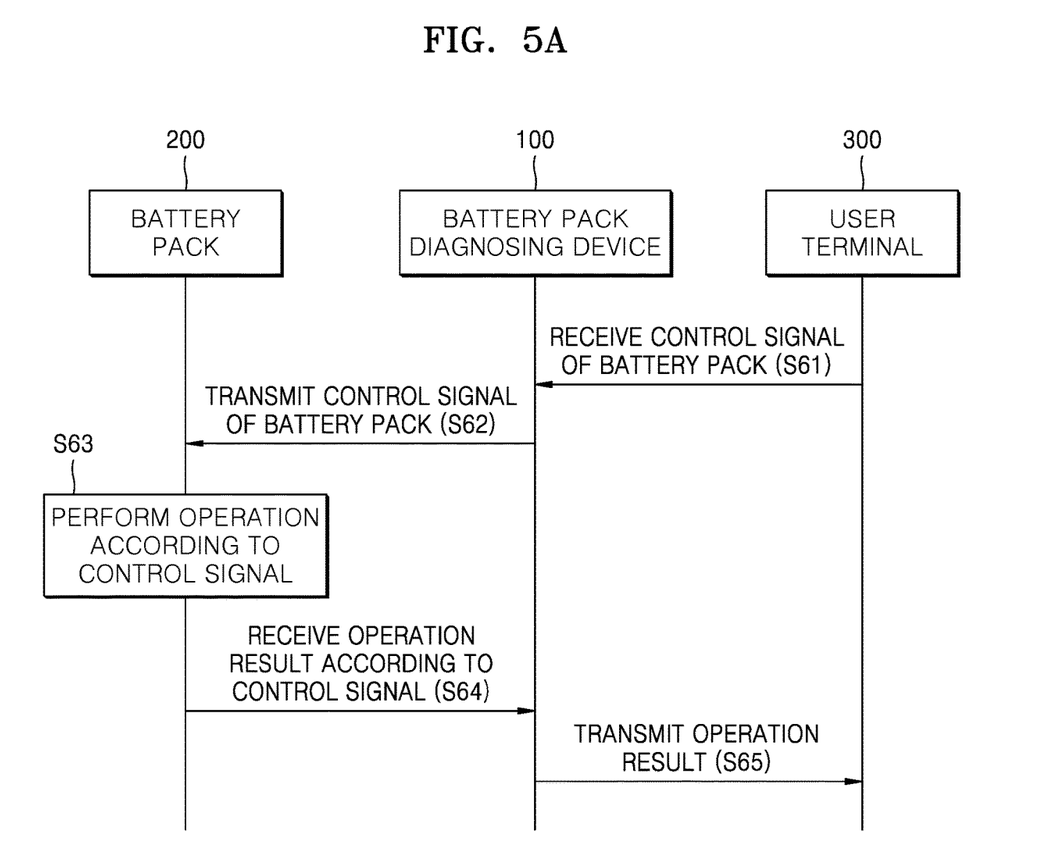
FIG. 5A is a diagram illustrating a process of transmitting a control signal of a battery pack received from a user terminal to the battery pack by a battery pack diagnosing device according to an embodiment of the present disclosure.

FIG. 5A is a diagram illustrating a process of transmitting a control signal of a battery pack 200, received from a user terminal 300, to the battery pack 200 by a battery pack diagnosing device 100 according to an embodiment of the present disclosure.

The controller 120 according to an embodiment of the present disclosure may receive a control signal of the battery pack 200 from the user terminal 300 through the communication unit 110 (operation S61). In this case, the control signal may be a signal for managing the battery pack 200 and may be, for example, an initialization signal of the battery pack 200, an error code (message) deletion signal of the battery pack 200, and a firmware upgrade signal of the battery pack 200.

The controller 120 according to an embodiment of the present disclosure may transmit the received control signal to the battery pack 200 through the first connection terminal 130 (operation S62). Upon receiving the control signal, the battery pack 200 may perform an operation corresponding to the control signal (operation S63) or, when the performance of the operation is impossible, may generate a message indicating the impossibility thereof.

The controller 120 according to an embodiment of the present disclosure may receive an operation result according to the control signal of the battery pack 200 from the battery pack 200 (operation S64) and transmit the received operation result to the user terminal 300 through the communication unit 110 (operation S65).

Accordingly, the present disclosure may enable the user to more quickly and easily detect the state of the battery pack 200 at a location where the battery pack 200 is installed and/or used and to take an immediate action on the battery pack 200 according to the detected state.

Figure 5B:
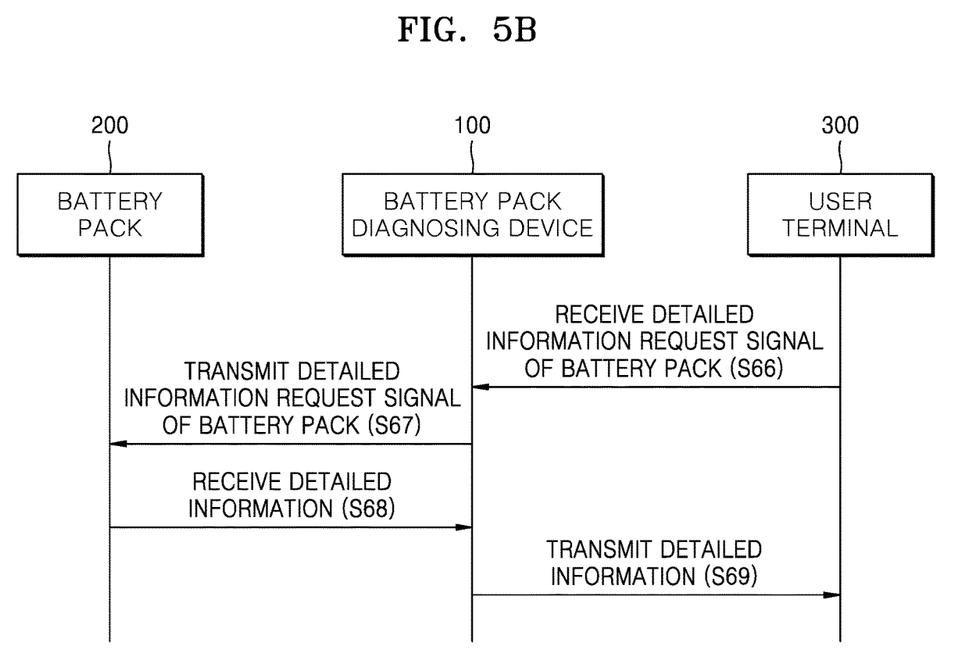
FIG. 5B is a diagram illustrating a process of transmitting a detailed information request signal of a battery pack received from a user terminal to the battery pack by a battery pack diagnosing device according to an embodiment of the present disclosure.

FIG. 5B is a diagram illustrating a process of transmitting a detailed information request signal of a battery pack 200, received from a user terminal 300, to the battery pack 200 by a battery pack diagnosing device 100 according to an embodiment of the present disclosure.

It has been described above that the battery pack 200 according to an embodiment of the present disclosure may broadcast its own state information through the established communication connection. In this case, the broadcasted state information may not include all the information of the battery pack 200. Thus, when the user needs more detailed state information that is not included in the broadcasted state information, the detailed state information may be received from the battery pack 200 through a separate request.

For this, the controller 120 according to an embodiment of the present disclosure may receive a detailed information request signal from the user terminal 300 through the communication unit 110 (operation S66).

The controller 120 according to an embodiment of the present disclosure may transmit the received detailed information request signal to the battery pack 200 through the first connection terminal 130 (operation S67). Upon receiving the detailed information request signal, the battery pack 200 may transmit the detailed information to the battery pack diagnosing device 100. In other words, the controller 120 according to an embodiment of the present disclosure may receive the detailed information from the battery pack 200 (operation S68) and transmit the received detailed information to the user terminal 300 through the communication unit 110 (operation S69).

Accordingly, the present disclosure may enable a more in-depth diagnosis on the battery pack 200 at a location thereof.

Figure 6:
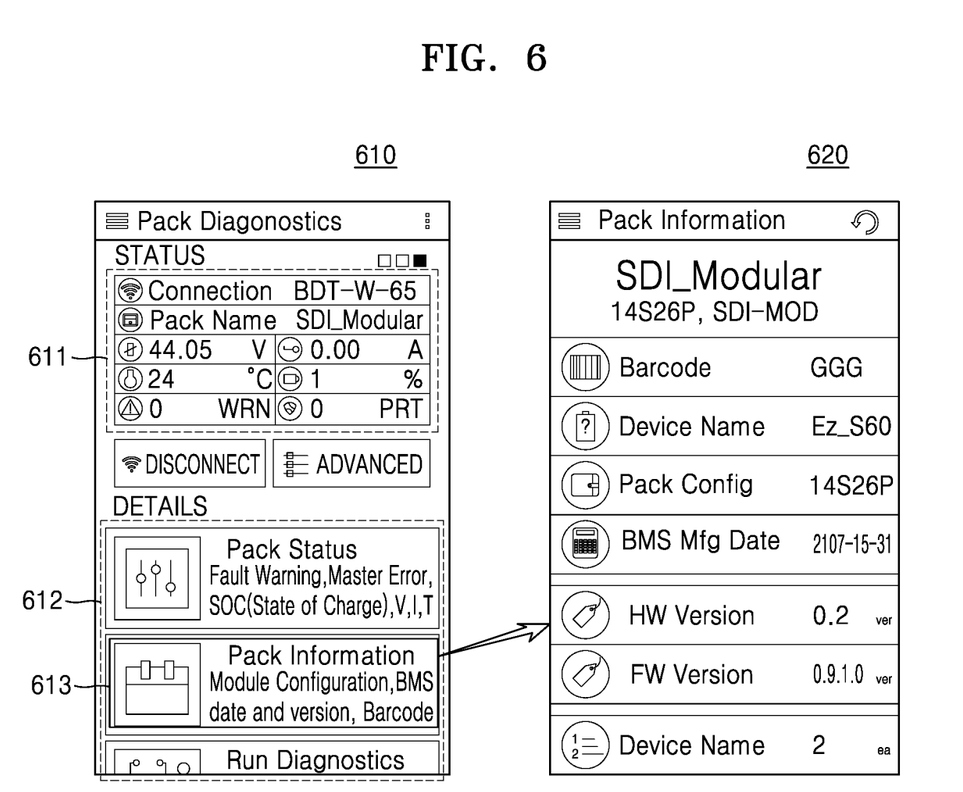
FIG. 6 illustrates an example of a screen where state information of a battery pack is displayed on a user terminal.

FIG. 6 illustrates an example of screens 610 and 620 where state information of a battery pack 200 is displayed on a user terminal 300.

Referring to FIG. 6, the screen 610 may include a region 611 in which basic information of the battery pack 200 is displayed and a region 612 in which a button is displayed to identify more detailed information of the battery pack 200 or to perform control of the battery pack 200.

As illustrated, connection information of the battery pack 200, identification information of the battery pack 200, the voltage of the battery pack 200, the number of warning messages of the battery pack 200, and/or the like may be displayed in the region 611 in which the basic information is displayed. The basic information may be information included in a signal broadcasted by the battery pack 200 as described above.

Meanwhile, when the user presses a button 613 to identify more detailed information of the battery pack 200, detailed information of the battery pack 200 may be further displayed as in the screen 620. The detailed information may be information included in a signal broadcasted by the battery pack 200 or may be information additionally acquired according to the process illustrated in FIG. 5B.

Figure 7:
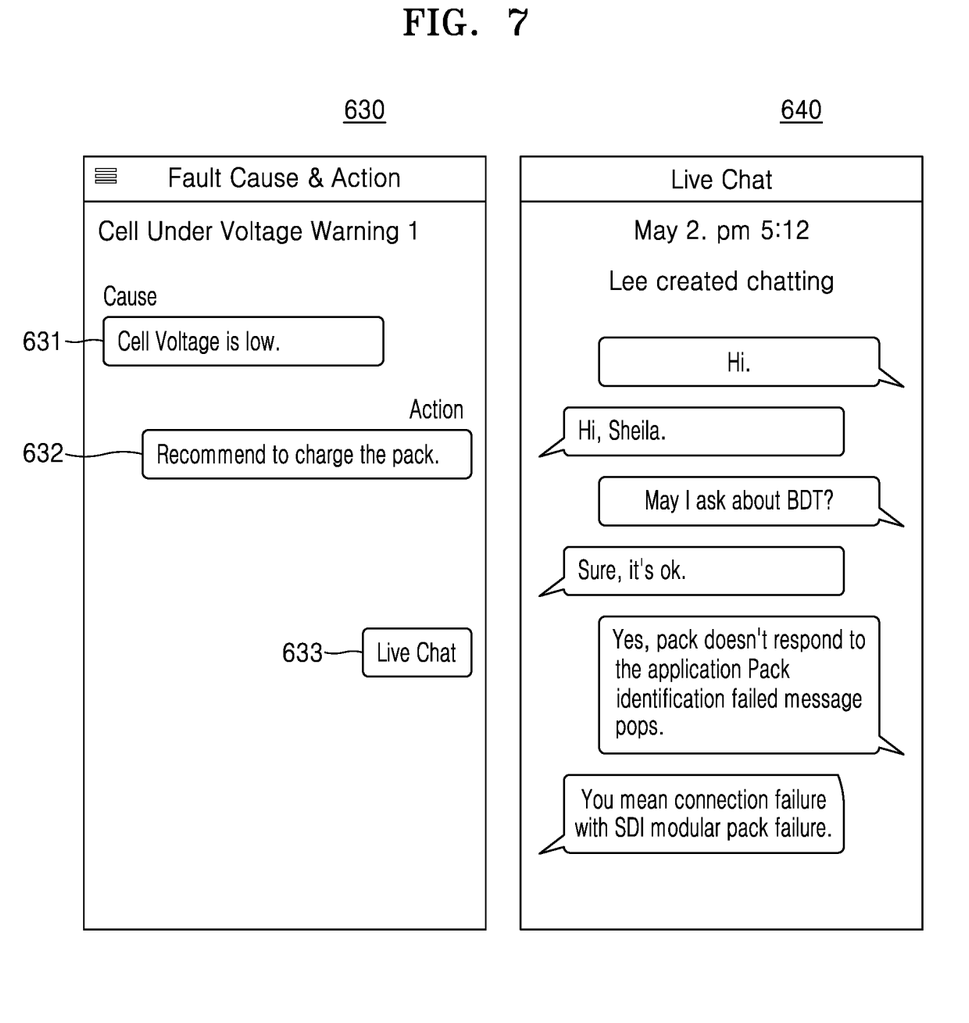
FIG. 7 illustrates an example of a screen where state information of a battery pack is displayed in a chat window on a user terminal.

FIG. 7 illustrates an example of screens 630 and 640 where state information of a battery pack 200 is displayed in a chat window on a user terminal 300.

As described above, the controller 120 according to an embodiment of the present disclosure may receive the state information of the battery pack 200 from the battery pack 200 and transmit the received state information to the user terminal 300 through the communication unit 110. In this case, the user terminal 300 may display the state of the battery pack 200 in a chat format as illustrated in FIG. 7.

For example, the user terminal 300 may display a state of the battery pack 200 and a solution corresponding to the state in the form of speech bubbles 631 and 632 based on the received state information as in the screen 630. Accordingly, the present disclosure may provide information about diagnosis and action of the battery pack 200 to the user through a more familiar interface.

Meanwhile, the user terminal 300 may further provide a button 633 to enable chat with an expert about the state of the battery pack 200. When the user performs an input on the button 633, a chat window like the screen 640 may be displayed. In this case, a chat partner may be a person corresponding to a provider of a technical support service for the battery pack 200.

The user may transmit the state information of the battery pack 200, received from the battery pack diagnosing device 100, through the chat window like the screen 640. Also, the chat partner (e.g., the person corresponding to the provider of the technical support service described above) may transmit a suitable action command for the battery pack 200 through the chat window. In other words, the user terminal 300 may generate a control signal of the battery pack 200, a detailed information request signal of the battery pack 200, and/or the like based on the input of the conversation partner on the chat window and transmit the same to the battery pack diagnosing device 100.

Accordingly, the present disclosure may enable real-time consultation with the expert about the battery pack 200 at a remote location and may enable the battery pack 200 to operate by reflecting a suitable action of the expert.

The present disclosure has been particularly shown and described with reference to example embodiments thereof. However, those of ordinary skill in the art will understand that various changes in form and details may be made therein without departing from the spirit and scope of the present disclosure as defined by the following claims. Therefore, the described embodiments should be considered in descriptive sense only and not for purposes of limitation. Thus, the scope of the present disclosure may be defined not by the above detailed descriptions but by the following claims, and all differences within the equivalent scope thereof will be construed as being included in the present disclosure.

The invention claimed is:

1. A battery pack diagnosing method comprising:
   generating, by a battery pack diagnosing device, a wake-up signal of a battery pack based on receiving a user activation of a switch of the battery pack diagnosing device and transmitting the wake-up signal to the battery pack through a first connection terminal electrically coupling the battery pack diagnosing device to the battery pack;
   establishing, by the battery pack diagnosing device, a communication connection according to a first communication method with the battery pack turned on based on the wake-up signal by assigning identification to, and mutually recognizing, the battery pack and the battery pack diagnosing device;

receiving, by the battery pack diagnosing device, state information of the battery pack through the established communication connection; and transmitting, by the battery pack diagnosing device, the received state information to a user terminal according to a wireless communication method.

2. The battery pack diagnosing method of claim 1, wherein the receiving of the state information comprises receiving a signal by which the battery pack broadcasts the state information.

3. The battery pack diagnosing method of claim 1, further comprising, after the transmitting of the received state information to the user terminal:

receiving at least one of a control signal of the battery pack and a detailed information request signal of the battery pack from the user terminal according to a second communication method;

when the received signal is the control signal of the battery pack, transmitting the control signal to the battery pack; and when the received signal is the detailed information request signal of the battery pack, receiving detailed information from the battery pack in response to the detailed information request signal and transmitting the received detailed information to the user terminal.

4. A battery pack diagnosing device mediating signal communication between a battery pack and a user terminal, the battery pack diagnosing device comprising:

a first connection terminal electrically connected to at least one of the battery pack and an apparatus equipped with the battery pack;

a first switch for changing a communication mode with the apparatus connected to the first connection terminal based on a user input;

a second switch for applying power to the battery pack diagnosing device based on a user input;

a second connection terminal for supplying power to the battery pack diagnosing device from a power supply external to the battery pack and the battery pack diagnosing device;

a communication unit for exchanging signals with the user terminal;

a third switch for acquiring a user input for transmitting a wake-up signal to the battery pack; and a controller electrically connected to the first switch, the second switch, the third switch, the first connection terminal, the second connection terminal, and the communication unit, wherein the controller generates the wake-up signal based on a user input to the third switch and transmits the generated wake-up signal to the battery pack through the first connection terminal, and establishes a communication connection according to a first communication method with the battery pack turned on based on the wake-up signal and receives state information of the battery pack through the established communication connection.

5. The battery pack diagnosing device of claim 4, further comprising:

a display unit displaying at least one of an operation state of the battery pack diagnosing device, a communication state according to a first communication method with the battery pack, a communication state according to a second communication method with the user terminal, and state information of the battery pack.

6. The battery pack diagnosing device of claim 4, wherein the controller transmits the received state information of the battery pack to the user terminal through the communication unit according to a second communication method.

7. The battery pack diagnosing device of claim 6, wherein the controller receives at least one of a control signal of the battery pack and a detailed information request signal of the battery pack from the user terminal through the communication unit.

8. The battery pack diagnosing device of claim 7, wherein the controller, when the received signal is the control signal of the battery pack, transmits the control signal to the battery pack through the first connection terminal, receives an operation result according to the control signal from the battery pack through the first connection terminal, and transmits the received operation result to the user terminal through the communication unit according to the second communication method.

9. The battery pack diagnosing device of claim 7, wherein the controller, when the received signal is the detailed information request signal of the battery pack, receives detailed information from the battery pack through the first connection terminal in response to the detailed information request signal and transmits the received detailed information to the user terminal through the communication unit according to the second communication method.

10. The battery pack diagnosing device of claim 7, wherein the state information of the battery pack transmitted to the user terminal according to the second communication method is displayed in a chat window of the user terminal, and at least one of the control signal of the battery pack and the detailed information request signal of the battery pack is generated based on an input of a chat partner to the chat window.

11. The battery pack diagnosing device of claim 10, wherein the chat partner includes a provider of a technical support service for the battery pack.

12. The battery pack diagnosing device of claim 4, further comprising:

a memory storing at least one of an operation state of the battery pack diagnosing device, a communication state according to a first communication method with the battery pack, a communication state according to a second communication method with the user terminal, and state information of the battery pack.

13. The battery pack diagnosing device of claim 4, wherein the state information of the battery pack includes state information of a battery management system (BMS) of the battery pack.

14. The battery pack diagnosing device of claim 4, wherein the battery pack includes a switch for controlling an operation of the battery pack, and the switch is turned on by the wake-up signal to turn on the battery pack.

* * * * *